(12) United States Patent
Lin

(10) Patent No.: US 6,238,825 B1
(45) Date of Patent: May 29, 2001

(54) MASK WITH ALTERNATING SCATTERING BARS

(75) Inventor: Benjamin Szu-Min Lin, Hsinchu (TW)

(73) Assignee: United Microelectronics Crop., Hsinchu (TW)

( * ) Notice: Subject to any disclaimer, the term of this patent is extended or adjusted under 35 U.S.C. 154(b) by 0 days.

(21) Appl. No.: 09/442,839

(22) Filed: Nov. 18, 1999

(51) Int. Cl.⁷ .................................................. G03F 9/00
(52) U.S. Cl. ................................................................ 430/5
(58) Field of Search .................... 430/5, 22, 296, 430/394, 322

(56) References Cited

U.S. PATENT DOCUMENTS 5,821,014 * 10/1998 Chen et al. ............................... 430/5
6,114,071 *  9/2000 Chen et al. ............................... 430/5

* cited by examiner

Primary Examiner—S. Rosasco

(57) ABSTRACT

A low duty ratio mask has a plurality of masked layout patterns and a plurality of alternating scattering bars placed next to edges of each masked layout pattern. A phase shift of 180° exists between the alternating scattering bars and the corresponding masked layout pattern.

5 Claims, 6 Drawing Sheets

MASK WITH ALTERNATING SCATTERING BARS

BACKGROUND OF THE INVENTION

1. Field of the Invention

The present invention relates to a mask with alternating scattering bars. More particularly, the present invention relates to a low duty ratio mask.

2. Description of the Prior Art

In the semiconductor industry, the lithography process is a very important and common fabrication process. Structures of MOS devices such as layout patterns and doping regions of thin films are defined by the lithography process.

Scattering bars are employed in the lithography process to reduce or eliminate proximity effects. Rectangular openings are disposed next to edges of masked layout patterns. During an exposure process, diffraction arises at the rectangular openings and eliminates the proximity effects of adjacent layout patterns.

Resolution of the lithography process determines a line width in the semiconductor manufacture. How to increase the resolution is an important issue for the semiconductor industry. Duty ratio for a patterning is one of the features which affects the resolution. The duty ratio represents the ratio of a line width and a pitch width in a semiconductor device being fabricated. In the lithography process, a duty ratio of 1 gives the best resolution.

When the integration is further increased, for example, contact holes of a giga-bit DRAM cell, the duty ratio is less than 1 (that is, the pitch width is larger than the line width). Such patterning has a poor resolution even when the scattering bars are employed.

FIG. 1A illustrates an exposed pattern of contact holes in a DRAM cell employing a conventional mask. Circular patterns represent positions of the contact holes. It is noted that some of the adjacent circular patterns overlap along their edges.

FIG. 1B illustrates an exposed pattern of FIG. 1A after a 0.3 microns defocus. Overlapping of edges is more serious, and hence, the masking process cannot be employed.

FIG. 2A illustrates an exposed pattern of contact holes in a DRAM cell employing a conventional mask with scattering bars. FIG. 2B illustrates an exposed pattern of FIG. 2A after a 0.3 microns defocus. Circular patterns represent positions of the contact holes. Rectangular bars indicate positions of the scattering bars. Overlapping of edges still exists. Therefore, the resolution is not improved even by employing the scattering bars.

SUMMARY OF THE INVENTION

Accordingly, the present invention provides a mask with alternating scattering bars which enhance the resolution of an exposed pattern, allowing attainment of proper layout patterns even for a less-than-1 duty ratio patterning.

Another object of the present invention is to provide a mask with alternating scattering bars which defines layout patterns having a less-than-1 duty ratio. The mask with alternating scattering bars has a larger process window than a conventional mask with or without scattering bars. High resolution is still maintained even after a 0.3 microns defocus.

Based on the foregoing, the present invention provides a mask with alternating scattering bars, which includes a plurality of masked layout patterns and a plurality of alternating scattering bars placed next to edges of each masked layout pattern. A phase shift of 180° exists between the alternating scattering bars and the corresponding masked layout pattern.

In accordance with a preferred embodiment of the present invention, if the alternating scattering bars have a phase of 180°, then the corresponding masked layout pattern will have a phase of 0°.

In accordance with the preferred embodiment of the present invention, if the alternating scattering bars have a phase of 0°, then the corresponding masked layout pattern will have a phase of 180°.

BRIEF DESCRIPTION OF THE DRAWINGS

The accompanying drawings are included to provide a further understanding of the present invention, and are incorporated in and constitute a part of this specification. The drawings illustrate preferred embodiments of the present invention and, together with the description, serve to explain the principles of the present invention. In the drawings.

DESCRIPTION OF THE PREFERRED EMBODIMENTS

The present invention provides a mask with alternating scattering bars. The alternating scattering bars are placed next to edges of masked layout patterns. The alternating scattering bars and the adjacent masked layout pattern are out of phase. In other words, if the masked layout pattern has a phase of 180°, the alternating scattering bars, which are placed next to the edges of the masked layout pattern, will have a phase of 0°. Alternatively, if the masked layout pattern has a phase of 0°, the alternating scattering bars will have a phase of 180°.

Figure 3A:
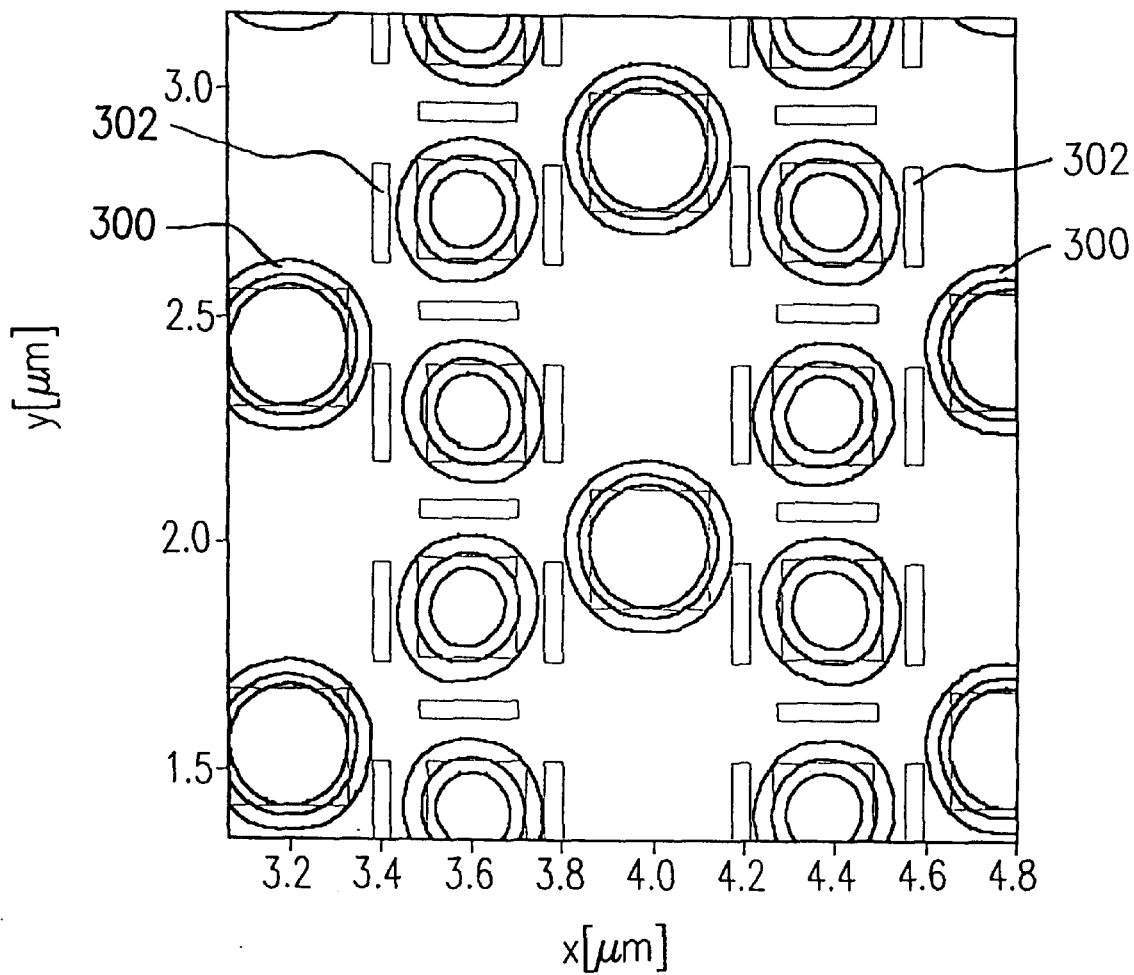
FIG. 3A is an exposed pattern of contact holes in a DRAM cell employing a mask with alternating scattering bars in accordance with a preferred embodiment of the present invention.

Reference is made to FIG. 3A, which illustrates an exposed pattern of contact holes in a DRAM cell employing a mask with alternating scattering bars in accordance with a preferred embodiment of the present invention. Circular patterns 300 of FIG. 3A are exposed patterns of the contact holes. Rectangular bars 302 next to the circular patterns 300 indicate positions of the alternating scattering bars. While the circular patterns 300 of FIG. 3A have a phase of 0° and a 100% transmission, the alternating scattering bars 302 have a phase of 180° and a 100% transmission. Alternatively, if the circular patterns 300 have a phase of 0°, the alternating scattering bars 302 will have a phase of 180°.

The alternating scattering bars 302 can be fabricated by a conventional phaseshifting mask fabrication method. The optimum number of the alternating scattering bars placed next to edges of a masked layout pattern is four.

Figure 1A:
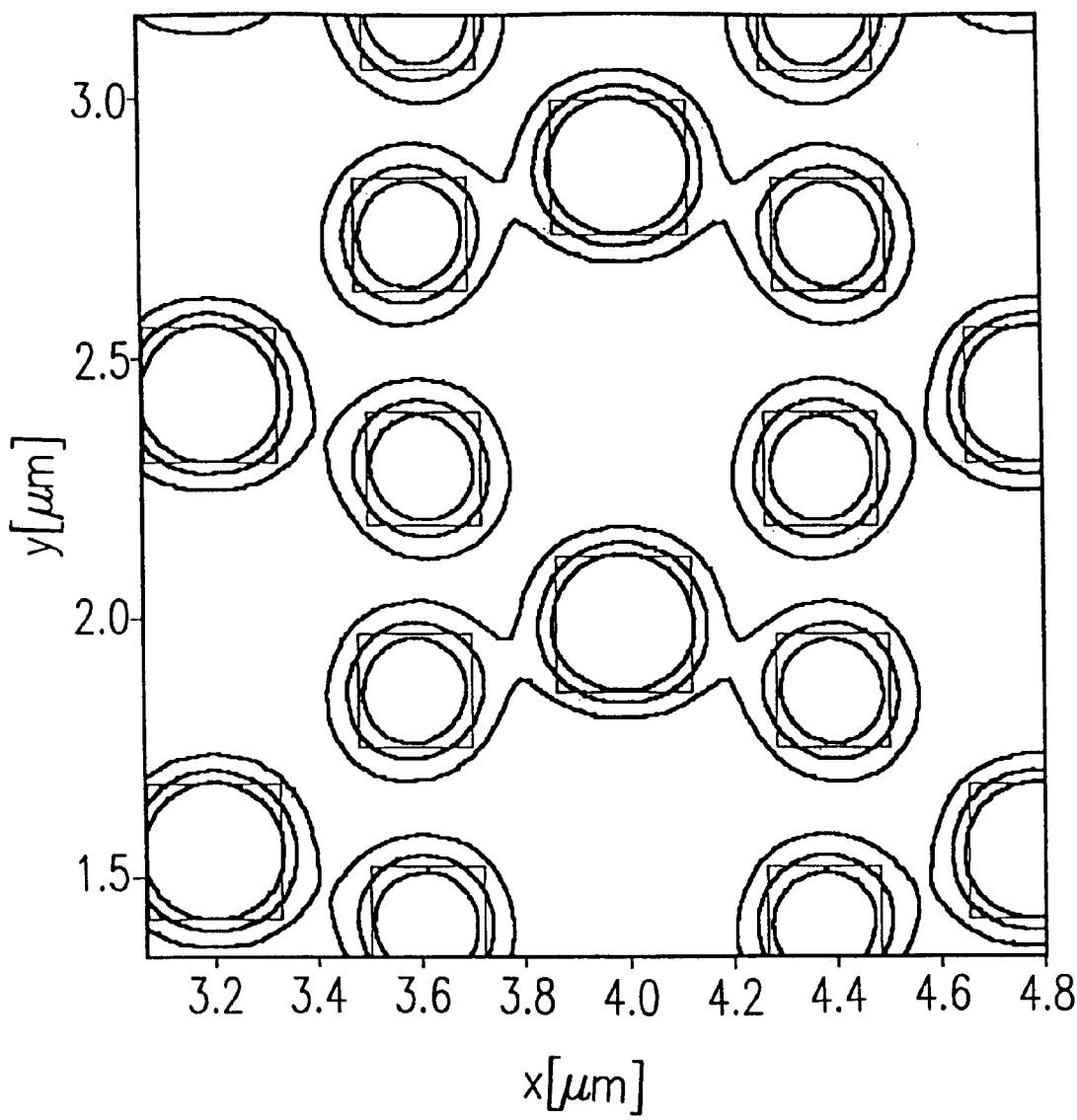
FIG. 1A is an exposed pattern of contact holes in a DRAM cell employing a conventional mask.
Figure 1B:
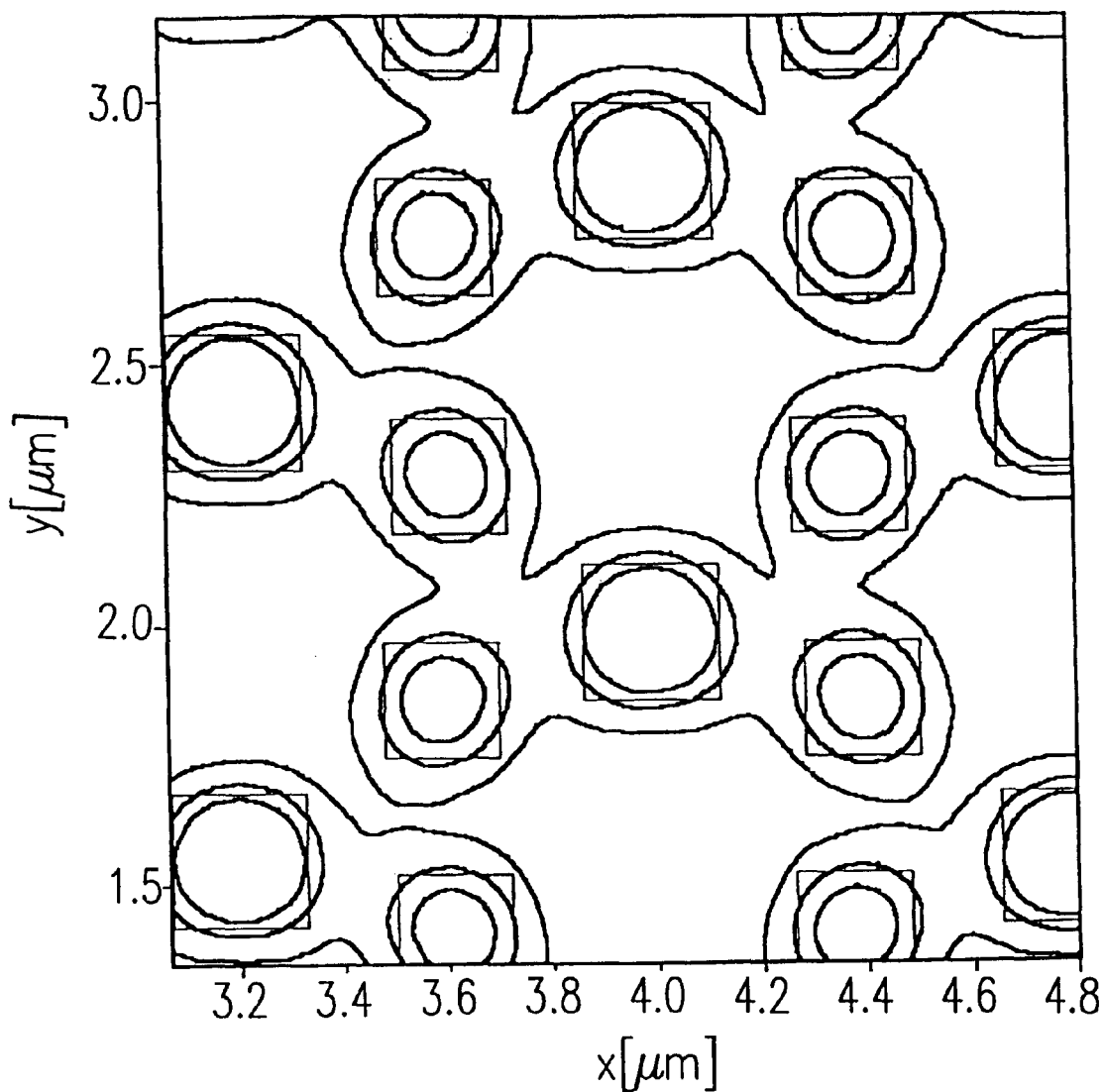
FIG. 1B is an exposed pattern of FIG. 1A after a 0.3 microns defocus.
Figure 2A:
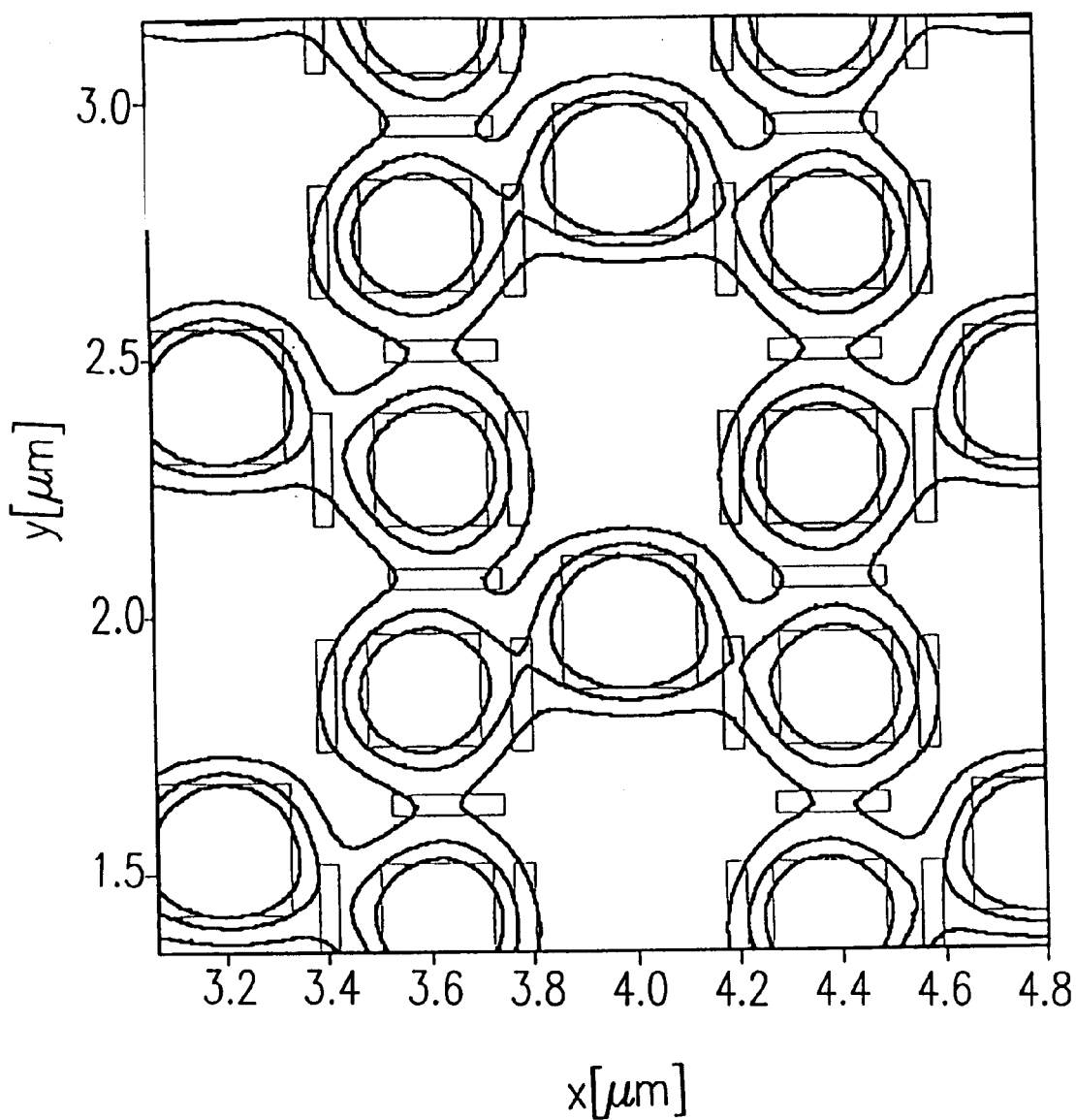
FIG. 2A is an exposed pattern of contact holes in a DRAM cell employing a conventional mask with scattering bars.
Figure 2B:
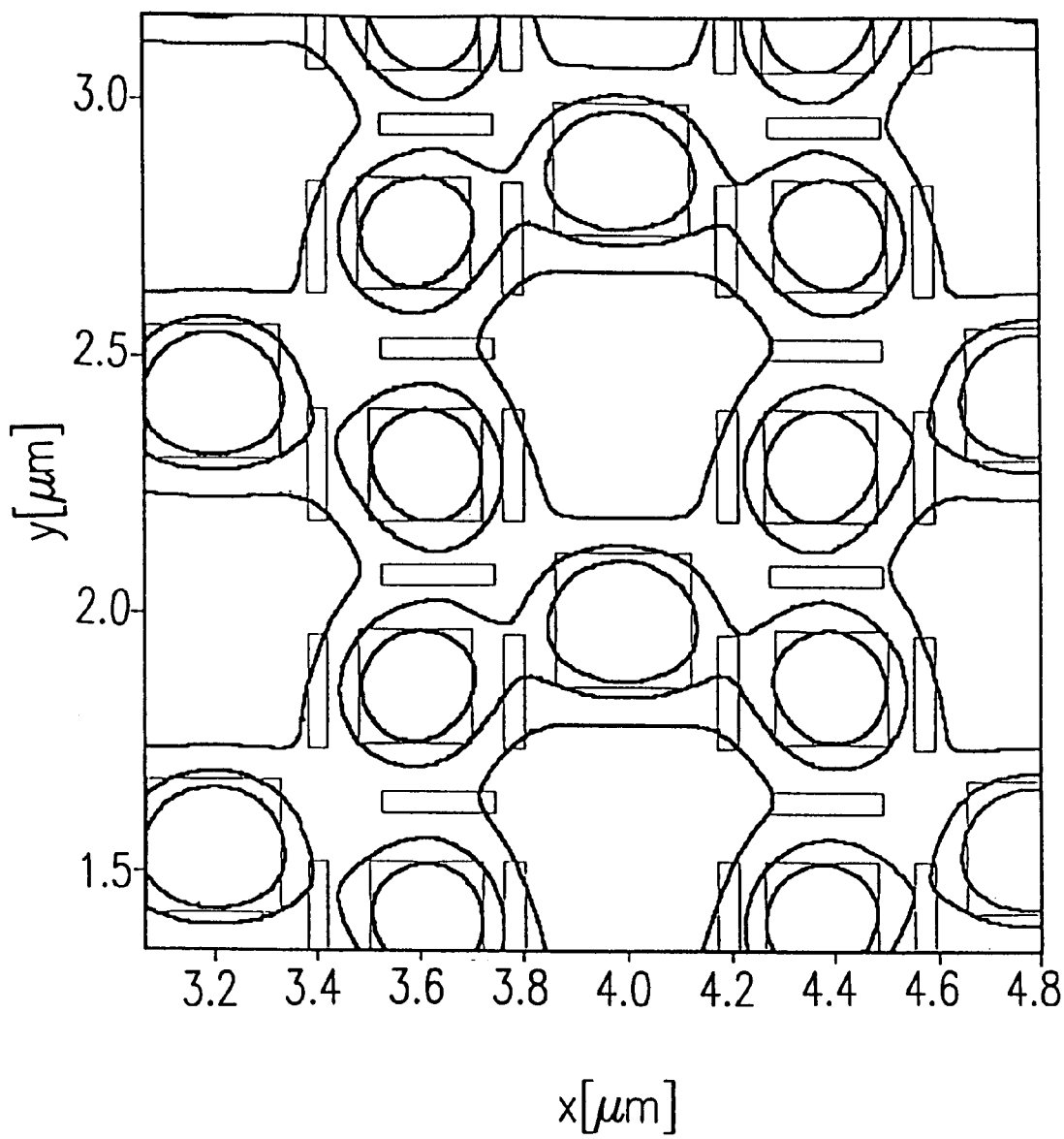
FIG. 2B is an exposed pattern of FIG. 2A after a 0.3 microns defocus.

Reference is made to FIGS. 2A and 3A. The resolution of FIG. 3A is much better than that of FIG. 2A. Thus, the alternating scattering bars 302 indeed enhance the resolution of a lithography process.

Figure 3B:
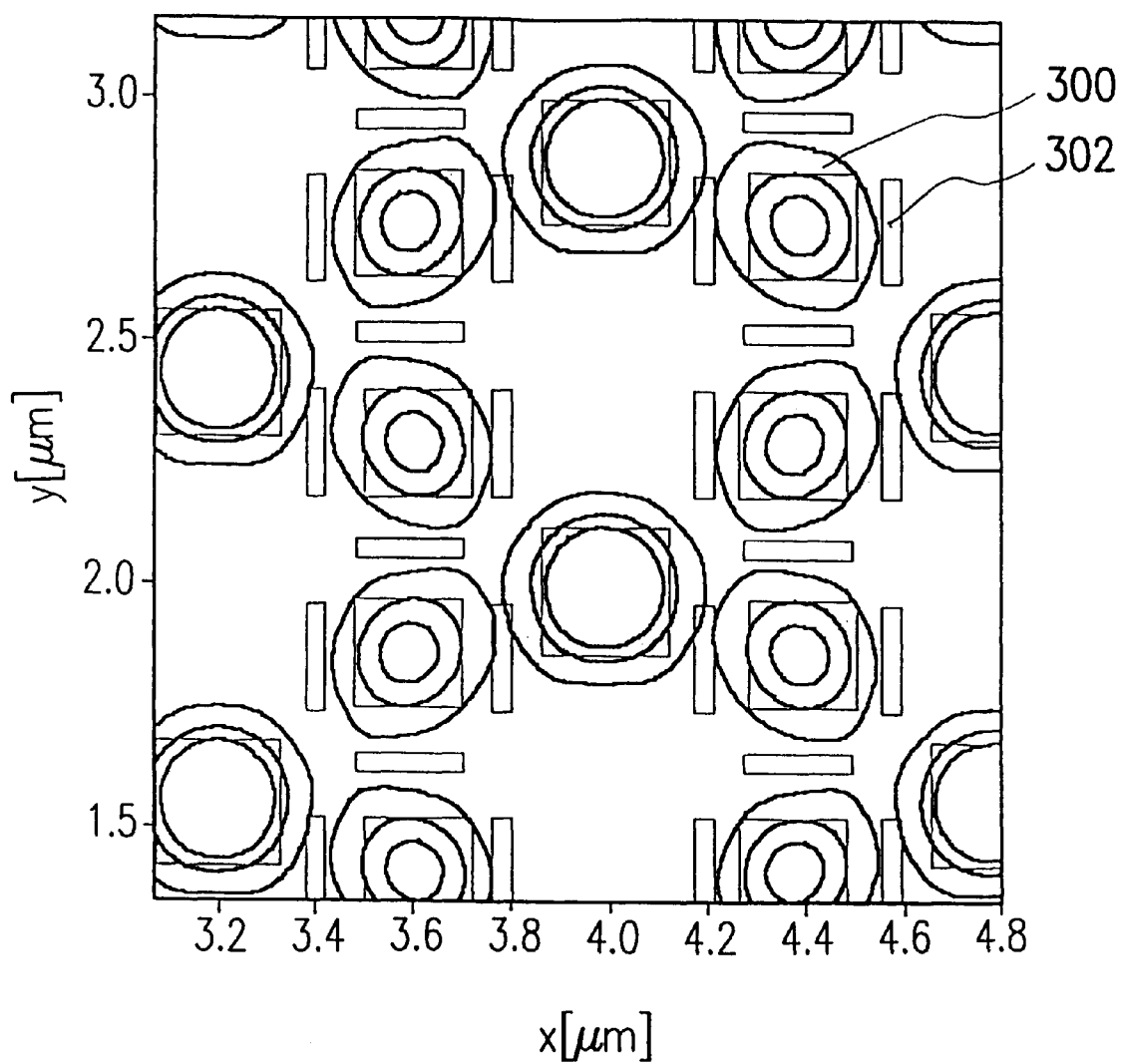
FIG. 3B is an exposed pattern of FIG. 3A after a 0.3 microns defocus.

Reference is made to FIG. 3B, which illustrates an exposed pattern of FIG. 3A after a 0.3 microns defocus. A high resolution still exists even after a 0.3 microns defocus. There is no overlap between isolated exposed patterns.

Based on the foregoing, the advantages of the present invention comprise:

1. A 180° phase shift exists between the masked layout patterns and the alternating scattering bars. By means of the phase shift, the resolution of a lithography process is increased.

2. The present invention is applicable to a low duty ratio patterning and a high resolution can be achieved.

While the present invention has been disclosed with reference to the preferred embodiment described above, it is not intended to limit the present invention in any way. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A mask with alternating scattering bars, comprising:
    a plurality of masked layout patterns; and
    a plurality of alternating scattering bars placed next to edges of each masked layout pattern, with a phase shift existing between the alternating scattering bars and the corresponding masked layout pattern.

2. The mask with alternating scattering bars of claim 1, wherein the phase shift is 180°.

3. The mask with alternating scattering bars of claim 1, wherein the alternating scattering bars have a phase of 180° and the corresponding masked layout pattern has a phase of 0°.

4. The mask with alternating scattering bars of claim 1, wherein the alternating scattering bars have a phase of 0° and the corresponding masked layout pattern has a phase of 180°.

5. The mask with alternating scattering bars of claim 1, wherein a duty ratio of the masked layout patterns can be less than 1.

* * * * *